United States Patent
New

(10) Patent No.: US 7,301,824 B1
(45) Date of Patent: Nov. 27, 2007

(54) METHOD AND APPARATUS FOR COMMUNICATION WITHIN AN INTEGRATED CIRCUIT

(75) Inventor: Bernard J. New, Carmel Valley, CA (US)

(73) Assignee: Xilinx, Inc., San Jose, CA (US)

(*) Notice: Subject to any disclaimer, the term of this patent is extended or adjusted under 35 U.S.C. 154(b) by 96 days.

(21) Appl. No.: 11/243,774

(22) Filed: Oct. 4, 2005

(51) Int. Cl.
*G11C 8/00* (2006.01)

(52) U.S. Cl. .................. 365/189.01; 365/189.02; 365/230.01; 365/230.02; 365/236; 326/38; 326/39

(58) Field of Classification Search ................ 326/38, 326/39; 365/189.01, 189.02, 230.02, 236
See application file for complete search history.

(56) References Cited

U.S. PATENT DOCUMENTS

| | | | |
|---|---|---|---|
| 5,804,986 A * | 9/1998 | Jones ........................ | 326/40 |
| 6,373,848 B1 * | 4/2002 | Allison et al. .............. | 370/401 |
| 6,388,464 B1 * | 5/2002 | Lacey et al. ................ | 326/40 |
| 7,038,952 B1 * | 5/2006 | Zack et al. ................ | 365/189.01 |
| 7,062,586 B2 | 6/2006 | Donlin et al. | |
| 2004/0015666 A1 * | 1/2004 | Rojas et al. ................ | 711/159 |

OTHER PUBLICATIONS

Xilinx, Inc.; Virtex-4 User Guide; Version 1.1; published Sep. 10, 2004; Chapter 4; "Block RAM"; available from Xilinx, Inc.; 2100 Logic Drive, San Jose, Califormia 95124; downloaded from http://direct.xilinx.com/bvdocs/userguides/ug070.pdf on Oct. 4, 2005; pp. 108-160.

* cited by examiner

*Primary Examiner*—Vibol Tan
(74) *Attorney, Agent, or Firm*—Robert Brush; Michael R. Hardaway

(57) ABSTRACT

Method and apparatus for communication within an integrated circuit is described. In one example, an integrated circuit includes a first logic circuit, a second logic circuit, first first-in-first-out (FIFO) logic, second FIFO logic, and an interconnection network. Each of the first FIFO logic and the second FIFO logic is configured for asynchronous serial communication over the interconnection network. Each of the first FIFO logic and the second FIFO logic is further configured to respectively communicate with each of the first logic circuit and the second logic circuit in respective synchronous time domains.

16 Claims, 5 Drawing Sheets

METHOD AND APPARATUS FOR COMMUNICATION WITHIN AN INTEGRATED CIRCUIT

FIELD OF THE INVENTION

One or more aspects of the present invention relate generally to programmable logic devices and, more particularly, to a method and apparatus for communication within an integrated circuit.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (known as a bitstream) into internal configuration memory cells that define how the CLBs, IOBs, and interconnect structure are configured. An FPGA may also include various dedicated logic circuits, such as memories, microprocessors, digital clock managers (DCMs), and input/output (I/O) transceivers.

As feature size within an FPGA becomes smaller, especially for dense routing in sub-quarter micron fabricated integrated circuits, globally synchronous communication at high clock frequencies over long-haul routing within an FPGA, such as FPGA internal module-to-module routing, is becoming more problematic due at least in part to an increase in resistance-capacitance (RC) time constants. In some instances, the signal delay of all available paths of the interconnect structure from a source circuit to a sink circuit is incompatible with the desired clock period. That is, as clock frequencies and delays in the interconnect structure are increased, a signal may not be able to propagate from one circuit to another within a clock cycle.

Accordingly, there exists a need in the art for point-to-point communication between respective portions of an integrated circuit, such as an FPGA.

SUMMARY OF THE INVENTION

Method and apparatus for communication within an integrated circuit is described. In one embodiment, an integrated circuit includes a first logic circuit, a second logic circuit, first first-in-first-out (FIFO) logic, second FIFO logic, and an interconnection network. Each of the first FIFO logic and the second FIFO logic is configured for asynchronous serial communication over the interconnection network. Each of the first FIFO logic and the second FIFO logic is further configured to respectively communicate with each of the first logic circuit and the second logic circuit in respective synchronous time domains.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Method and apparatus for communication in an integrated circuit is described. One or more aspects of the invention are described with respect to communication within an FPGA. Those skilled in the art will appreciate that the present invention may be used with other types of integrated circuits, such as application specific integrated circuits (ASICs), application specific standard products (ASSPs), complex programmable logic devices (CPLDs), and the like.

Figure 1:
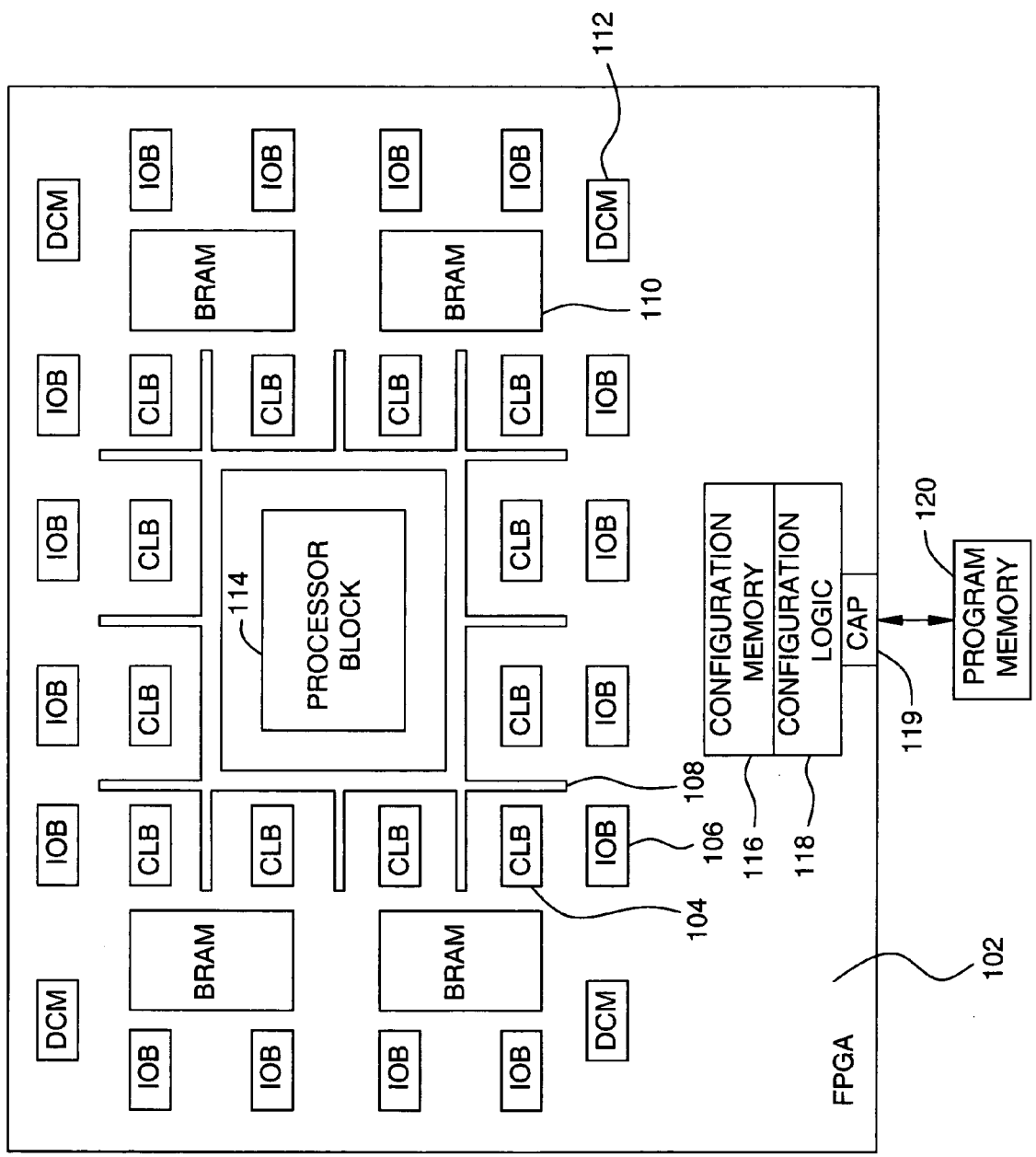
FIG. 1 is a block diagram depicting an exemplary embodiment of an FPGA coupled to a program memory.

FIG. 1 is a block diagram depicting an exemplary embodiment of an FPGA 102 coupled to a program memory 120. The FPGA 102 illustratively comprises programmable logic circuits or "blocks", illustratively shown as CLBs 104, IOBs 106, and programmable interconnect 108 (also collectively referred to as "programmable logic"), as well as configuration memory 116 for determining the functionality of the FPGA 102. The FPGA 102 may also include an embedded processor block 114, as well as various dedicated internal logic circuits, illustratively shown as blocks of random access memory ("BRAM 110"), configuration logic 118, digital clock management (DCM) blocks 112, and input/output (I/O) transceiver circuitry 122. Those skilled in the art will appreciate that the FPGA 102 may include other types of logic blocks and circuits in addition to those described herein.

As is well known in the art, the IOBs 106, the CLBs 104, and the programmable interconnect 108 may be configured to perform a variety of functions. Notably, the CLBs 104 are programmably connectable to each other, and to the IOBs 106, via the programmable interconnect 108. Each of the CLBs 104 may include one or more "slices" and programmable interconnect circuitry (not shown). Each CLB slice in turn includes various circuits, such as flip-flops, function generators (e.g., a look-up tables (LUTs)), logic gates, memory, and like type well-known circuits. The IOBs 106 are configured to provide input to, and receive output from, the CLBs 104.

Configuration information for the CLBs 104, the IOBs 106, and the programmable interconnect 108 is stored in the configuration memory 116. The configuration memory 116 may include static random access memory (SRAM) cells. The configuration logic 118 provides an interface to, and loads configuration data to, the configuration memory 116. A stream of configuration data ("configuration bitstream") produced from the program memory 120 may be coupled to the configuration logic 118 through a configuration port 119. The configuration process of FPGA 102 is also well known in the art.

The DCM blocks 112 provide well-known clock management circuits for managing clock signals within the FPGA 102, such as delay lock loop (DLL) circuits and multiply/divide/de-skew clock circuits. The processor block 114 comprises a microprocessor core, as well as associated control logic. Notably, such a microprocessor core may include embedded hardware or embedded firmware or a combination thereof for a "hard" or "soft" microprocessor. A soft microprocessor may be implemented using the programmable logic of the FPGA 102 (e.g., CLBs 104, IOBs 106). For example, a MICROBLAZE soft microprocessor, available from Xilinx of San Jose, Calif., may be employed. A hard microprocessor may be implemented using an IBM POWER PC, Intel PENTIUM, AMD ATHLON, or like type processor core known in the art.

The processor block 114 is coupled to the programmable logic of the FPGA 102 in a well known manner. For purposes of clarity by example, the FPGA 102 is illustrated with 12 CLBs, 16 IOBs, 4 BRAMs, 4 DCMs, and one processor block. Those skilled in the art will appreciate that actual FPGAs may include one or more of such components in any number of different ratios. For example, the FPGA 102 may be selected from the VIRTEX-4 family of products, commercially available from Xilinx, Inc. of San Jose, Calif.

Figure 2:
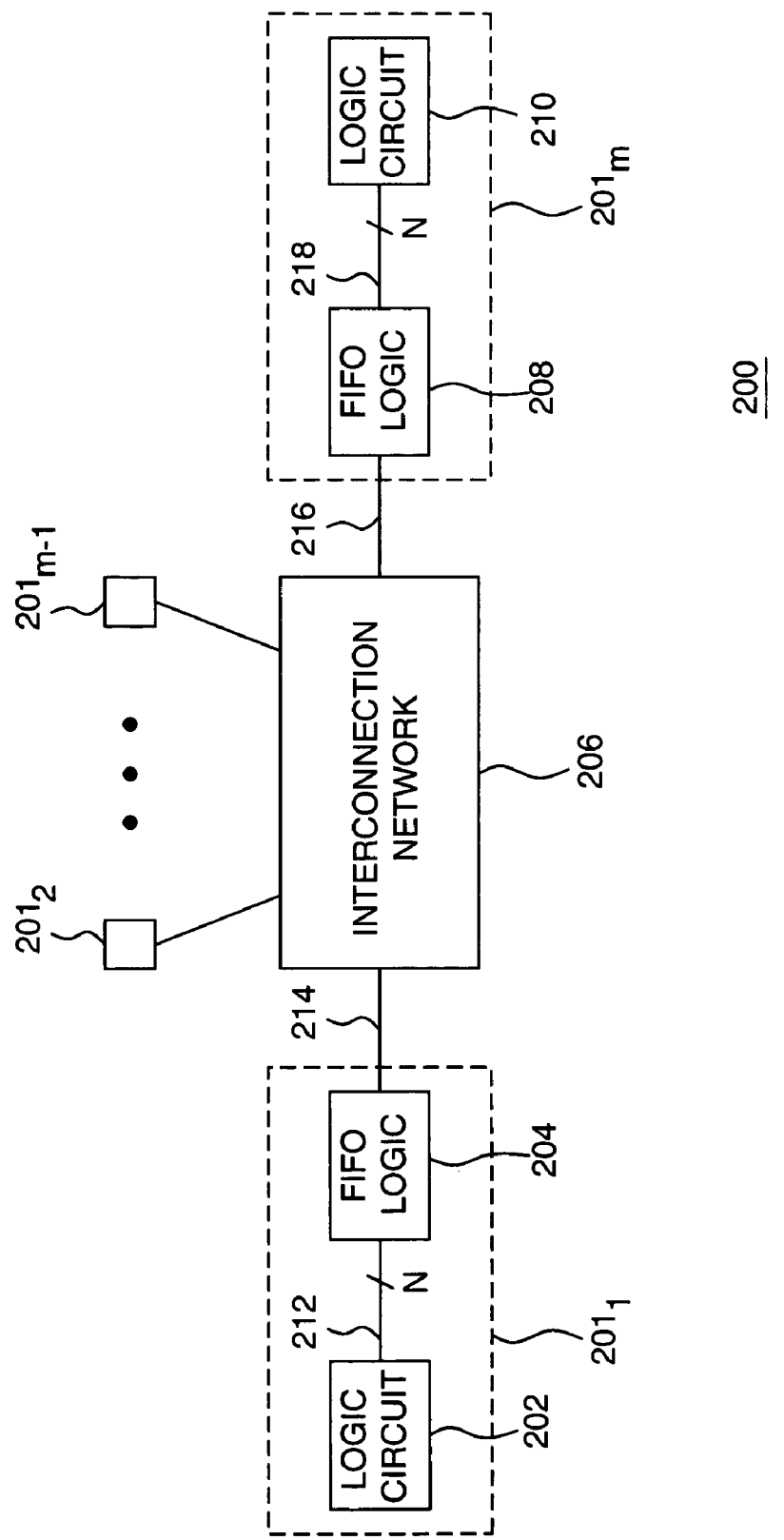
FIG. 2 depicts a block diagram showing an exemplary embodiment of a portion of the FPGA of FIG. 1 configured for internal communication in accordance with the invention.

FIG. 2 depicts a block diagram showing an exemplary embodiment of a portion 200 of the FPGA 100 configured for internal communication in accordance with the invention. The FPGA 100 includes portions $201_1$ through $201_M$ (collectively referred to as portions 201), where M is an integer greater than one, coupled to an interconnection network. Each of the portions 201 includes a logic circuit and one or more sets of FIFO logic, where each set of FIFO logic comprises a port to the interconnection network 206. The portions 201 are configured for asynchronous serial communication amongst one another through the interconnection network 206. Note that the portions 201 are logical portions of a circuit configured in the FPGA 100, rather than actual physical portions of the FPGA 100.

For purposes of clarity by example, only the portions $201_1$ and $201_M$ are shown in detail. It is to be understood that the other portions $201_2$ through $201_{M-1}$ may be configured similarly. The portion $201_1$ includes a logic circuit 202 and first-in-first-out (FIFO) logic 204. The portion $201_M$ includes a logic circuit 210 and FIFO logic 208. The logic circuits 202 and 210 may comprise circuits configured within the FPGA 100 using the programmable resources (e.g., CLBs, IOBs, programmable interconnect) thereof. The logic circuit 202 includes N input/output (I/O) terminals 212, where N is an integer greater than zero. The I/O terminals 212 are coupled to a parallel interface of the FIFO logic 204. The FIFO logic 204 includes an asynchronous serial interface 214 coupled to the interconnection network 206. The logic circuit 210 includes N I/O terminals 216. The I/O terminals 216 are coupled to a parallel interface of the FIFO logic 208. The FIFO logic 208 includes an asynchronous serial interface 218 coupled to the interconnection network 206. In one embodiment, each of the FIFO logic 204 and 208 is implemented using BRAM in the FPGA 100. An exemplary embodiment of FIFO logic is described below with respect to FIG. 3.

The FIFO logic 204 and the FIFO logic 208 are configured to serialize signals input from the I/O terminals 212 and the I/O terminals 218, respectively. The FIFO logic 204 and the FIFO logic 208 are configured to respectively couple serialized bitstreams to the interconnection network 206. The FIFO logic 204 and the FIFO logic 208 are also configured to deserialize bitstreams received from the interconnection network 206. The FIFO logic 204 and the FIFO logic 208 are configured to respectively provide deserialized signals to the logic circuit 202 and the logic circuit 210, which as indicated above is a parallel transmission with N signal channels. Conventional status and command signals of the FIFO logic 204 and the FIFO logic 208 are omitted for clarity.

In one embodiment, the interconnection network 206 is independent from programmable interconnect of the FPGA 100. That is, no programmable interconnect fabric of the FPGA 100 is used to implement the interconnection network 206. This allows the logic circuit 202 to communicate with the logic circuit 210, namely, FPGA point-to-point ("internal") communication without using FPGA fabric. The interconnection network 206 may be configured to support multiple asynchronous serial communication channels between pairs of the portions 201 (e.g., an asynchronous serial communication channel between the portion $201_1$ and the portion $201_M$). Exemplary embodiments of the interconnection network 206 are described below with respect to FIGS. 4 and 5.

In operation, communication between the logic circuit 202 and the logic circuit 210 is implemented using point-to-point communication between the FIFO logic 204 and the FIFO logic 208 over the interconnection network 206. In one embodiment, an asynchronous serial communication channel is established through the interconnection network 206 between the FIFO logic 202 and the FIFO logic 208. For example, data output by the logic circuit 202 may be serialized by the FIFO logic 204, transmitted asynchronously over the interconnection network 206, deserialized by the FIFO logic 204, and provided to the logic circuit 210.

For example, each of the logic circuit 202 and the logic circuit 210 may be designed to operate synchronously within a range of operating clock frequencies using the FPGA fabric. Due to one or more of the rate of clock frequency and propagation delay, however, synchronous communication between the logic circuit 202 and the logic circuit 210 using the FPGA fabric may not be achievable within a single clock period. As such, the logic circuit 202 may be designed to communicate with the logic circuit 210 using the FIFO logic 204 and the FIFO logic 208.

For purposes of clarity by example, each of the portions $201_1$ and $201_M$ include a single set of FIFO logic (i.e., a single port to the interconnection network 206). Those skilled in the art will appreciate that each of the portions 201 may include multiple sets of FIFO logic (i.e., multiple ports to the interconnection network 206). For example, each of the logic circuits 202 and 210 may be coupled to two sets of FIFO logic, one for transmission of serialized bitstreams, and one for reception of serialized bitstreams, from the interconnection network 206.

In order to more effectively employ asynchronous communication between the logic circuit 202 and the logic circuit 210, interaction between the logic circuit 202 and the logic circuit 210 should be somewhat latency tolerant. By moving signals from a synchronous domain to an asynchronous domain, high-speed, asynchronous serial transmission is used to facilitate communication at the expense of some latency at the receiving side.

Figure 3:
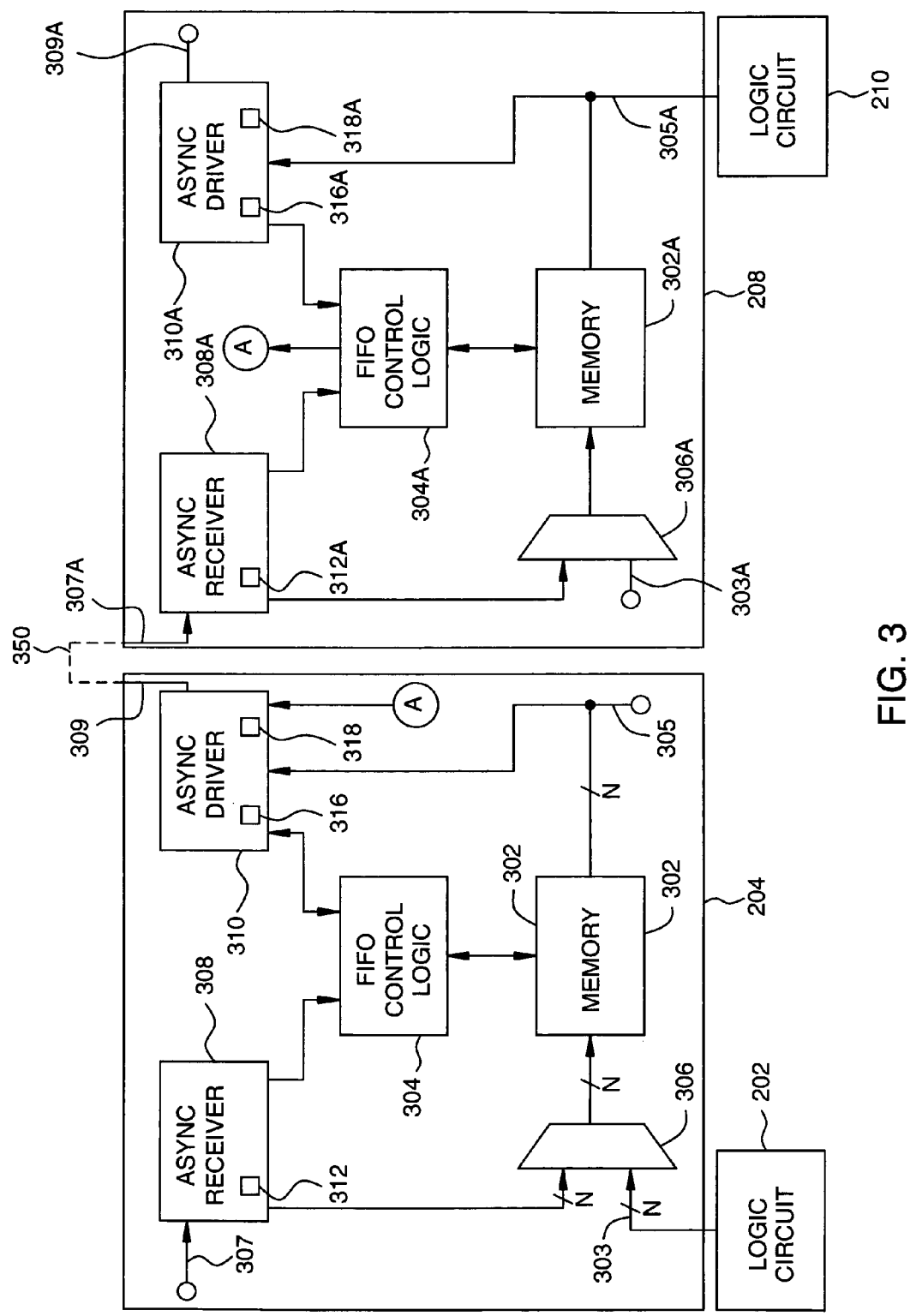
FIG. 3 is a more detailed block diagram depicting the internal communication between logic circuits of FIG. 2.

FIG. 3 is a more detailed block diagram depicting the internal communication between the logic circuit 202 and the logic circuit 210 of FIG. 2. The configuration of the FIFO logic 204 and the FIFO logic 208 shown in FIG. 3 may be used as the FIFO logic in any of the portions 201 of FIG. 2 as ports to the interconnection network 206. The FIFO logic 204 comprises a memory 302, FIFO control logic 304, a multiplexer 306, an asynchronous receiver 308, an asynchronous driver 310, an asynchronous input terminal 307, an asynchronous output terminal 309, a data input terminal 303, and a data output terminal 305. The asynchronous receiver 308 includes a deserializer 312. The asynchronous driver 310 includes a serializer 316 and control logic 318.

The configuration of the FIFO logic 208 is similar to that of the FIFO logic 204. Namely, the FIFO logic 208 comprises a memory 302A, FIFO control logic 304A, a multiplexer 306A, an asynchronous receiver 308A, an asynchronous driver 310A, an asynchronous input terminal 307A, an asynchronous output terminal 309A, a data input terminal 303A, and a data output terminal 305A. The asynchronous receiver 308A includes a deserializer 312A. The asynchronous driver 310A includes a serializer 316A and control logic 318A. The elements 302A through 318A are respectively similar to the elements 302 through 318. While only the elements 302 through 318 are described in detail below for purposes of clarity, the same description applies to the elements 302A through 318A.

The asynchronous input terminal 307 is configured to receive serialized bitstreams (e.g., from the interconnection network 206 of FIG. 2). An input port of the asynchronous receiver 308 is coupled to the asynchronous input terminal. The deserializer 312 is configured to deserialize the received bitstream. An output port of the asynchronous receiver 308 is coupled to an input port of the multiplexer 306. Another input port of the multiplexer 306 is coupled to the data input terminal 303. The data input terminal 303 is generally configured to receive parallel data (e.g., N-bit words from a logic circuit). A selection port of the multiplexer 306 is controlled by a configuration bit in the FPGA.

An output port of the multiplexer 306 is coupled to a data port ("write port") of the memory 302. The memory 302 comprises a dual-port memory, such as a dual-port RAM (e.g., BRAM in the FPGA 100). A second data port ("read port") of the memory 302 is coupled to the data output terminal 305. A control interface of the memory 302 is coupled to the FIFO control logic 304. The control interface of the memory 302 is configured to receive address and control information (e.g., write and read enables, reset signals, and the like) from the FIFO control logic 304. An input interface of the FIFO control logic 304 is coupled to an output port of the asynchronous receiver 308. An I/O interface of the FIFO control logic 304 is coupled to an I/O port of the asynchronous driver 310. The FIFO control logic 304 provides various status signals associated with a FIFO implemented in the memory 306, such as empty status, full status, almost full status, almost empty status, and like type signals known in the art.

An input port of the asynchronous driver 310 is coupled to the read port of the memory 302 (i.e., the data output port 305). The serializer 316 is configured to serialize the data from memory. An output port of the asynchronous driver 310 is coupled to the asynchronous output terminal 309. The asynchronous output terminal 309 is configured to provide serialized bitstreams (e.g., to the interconnection network 206 of FIG. 2). In one embodiment of the invention, the elements 302 through 318 may comprise dedicated circuitry and disposed in the FPGA 100 as a "BRAM tile". The BRAM tile may be replicated throughout the FPGA 100.

In operation, the FIFO control logic 304 implements a logical FIFO in the memory 302. An example of memory logic and associated FIFO control logic that may be used with an embodiment of the invention is described in Chapter 4 of "The Virtex-4 User Guide," version 1.1, published Sep. 10, 2004, by Xilinx, which is incorporated by reference herein in its entirety. Another example, of the FIFO control logic 304 and associated BRAM may be found in the Virtex 4 FPGA product from Xilinx, Inc. of San Jose, Calif. Data may be pushed into the FIFO from either the data input terminal 303 or from the asynchronous receiver 308 by selecting the appropriate input port of the multiplexer 306. In one embodiment, selection of the input ports of the multiplexer 306 is controlled via a configuration bit in the FPGA. Data may be popped from the FIFO and coupled to both the data output port 305 and the asynchronous driver 310.

In one embodiment of the invention, the asynchronous receiver 308 and the asynchronous driver 310 comprise a single transceiver circuit. The serializer 312 and the deserializer 316 may be implemented using a serializer/deserializer (SERDES).

Communication between the logic circuit 202 and the logic circuit 210 may be understood with reference to the following example. Data generated by the logic circuit 202 (e.g., N-bit data) is coupled to the data input terminal 303 and pushed into the FIFO implemented by the memory 202 and the FIFO control logic 304. The multiplexer 306 selects the data input terminal 303. The control logic 318 in the asynchronous driver 310 identifies that the FIFO is not empty by reading the state of the empty status signal output by the FIFO control logic 304. The control logic 318 pops data from the FIFO. The serializer 316 in the asynchronous driver 310 serializes the popped data. The asynchronous driver 310 then outputs the serialized bitstream via the asynchronous output terminal 309.

As described above, the asynchronous output terminal 309 is coupled to an interconnection network. In the present example, the interconnection network is configured to provide a connection path 350 to the asynchronous input terminal 307A of the FIFO logic 208. The serialized bitstream produced by the asynchronous driver 310 is received by the asynchronous receiver 308A. The deserializer 312A deserializes the data and the deserialized data is pushed into the FIFO implemented by the memory 302A and the FIFO control logic 304A. The multiplexer 306A selects the output of the asynchronous receiver 308A. The logic circuit 210 may pop data from the FIFO via the data output terminal 305A. In this manner, data is transmitted from the logic circuit 202 to the logic circuit 210 via an asynchronous serialized communication channel.

In some applications, data might arrive in the FIFO logic 208 faster than it is being removed by the logic circuit 210. In this case, it is necessary to prevent the FIFO implemented by the FIFO control logic 304A and the memory 302A from overflowing. In one embodiment, the FIFO control logic 304A may be configured to transmit an indication of its almost full state to the asynchronous driver 310 of the FIFO logic 204. In response to the FIFO logic 208 being almost full, the asynchronous driver 310 may be configured to cease transmission of data. The FIFO logic 208 need only have enough remaining headroom when the almost-full flag is set to accommodate the amount of data that might have been transmitted before the FIFO logic 204 received the almost full indication. The communication of the almost full indication from the FIFO logic 208 to the FIFO logic 204 may be asynchronous. In one embodiment, the almost full indication may be transmitted using the programmable interconnect of the FPGA 100. The FIFO control logic 304A may transmit an indication of the de-assertion of the almost full flag when the FIFO is again ready to receive data.

Although some embodiments of the invention have been described with respect to communication between the FIFO logic 204 and the FIFO logic 208, it is to be understood that each of the FIFO logic 204 and the FIFO logic 208 may operate as a local FIFO. That is, the logic circuit 202 may push data into the FIFO logic 204 via the input port 303 and pop data from the FIFO logic 204 via the output port 305. Similarly, the logic circuit 210 may push data into the FIFO logic 208 via the input port 303A and pop data from the FIFO logic 208 via the output port 305A. Furthermore, in another embodiment, multiple FIFO logic circuits may be chained together (as the FIFO logic 204 is chained with the FIFO logic 208), but appear as a local FIFO to a single logic circuit 202. For example, the logic circuit 202 may push data into the FIFO logic 204 via the input port 303 and pop data from the FIFO logic 208 via the output port 305A. This allows a logic circuit to utilize multiple FIFO logic circuits distributed across the FPGA as a single local FIFO.

In another embodiment, each of the FIFO logic 204 and the FIFO logic 208 includes multiple asynchronous receivers and drivers. Notably, communication between the FIFO logic 204 and the FIFO logic 208 may take place over more than one wire (i.e., between multiple receivers and drivers) using a technique known in the art as channel bonding.

Figure 4:
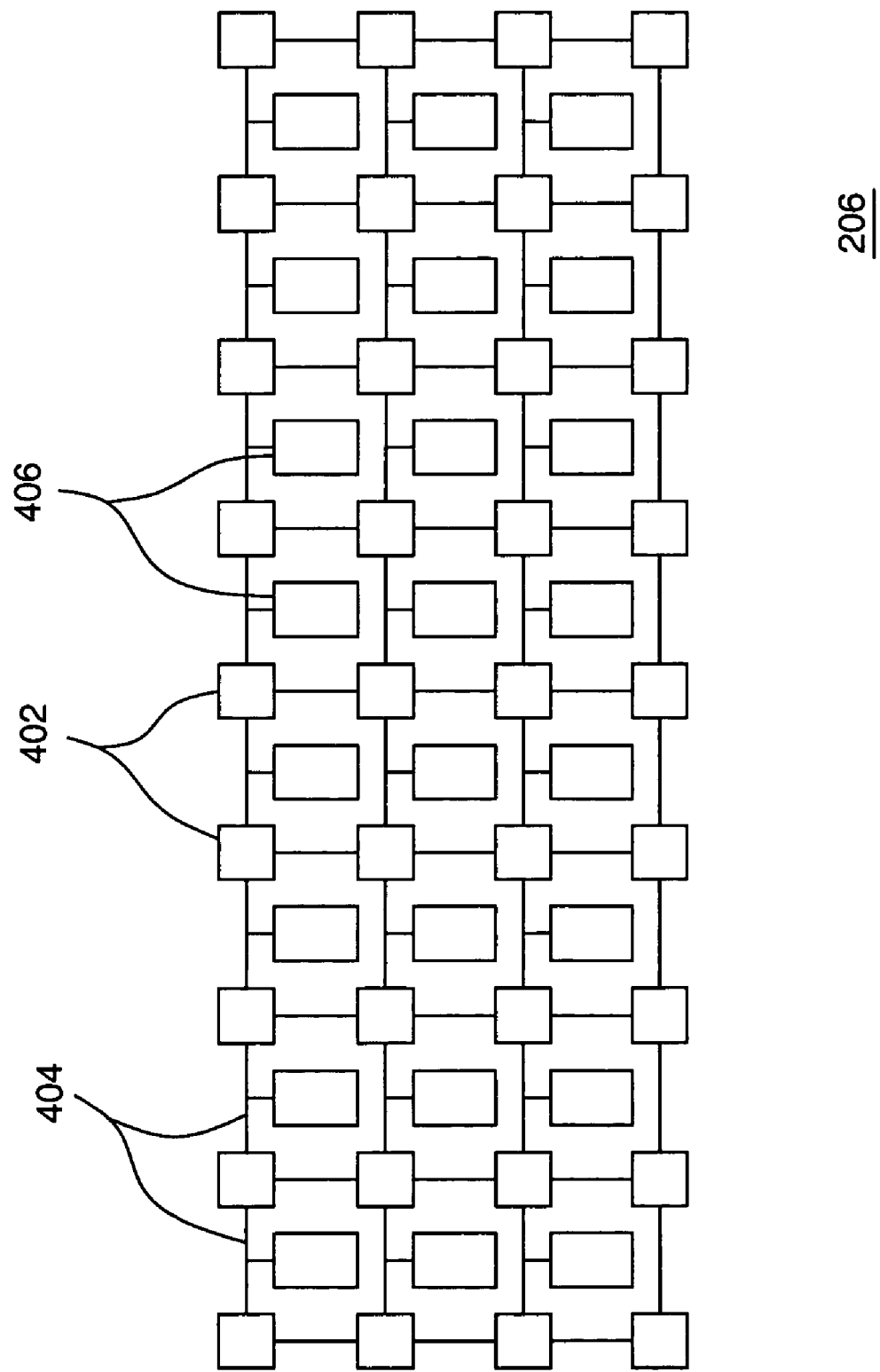
FIG. 4 is a block diagram depicting an exemplary embodiment of an interconnection network of FIG. 2 in accordance with the invention.

FIG. 4 is a block diagram depicting an exemplary embodiment of the interconnection network 206 of FIG. 2 in accordance with an embodiment of the invention. The interconnection network 206 comprises a matrix of switch boxes 402 and interconnect 404 ("mesh network"). The interconnect 404 (e.g., signal conductors) connect pairs of adjacent switch boxes 402 to form a routing matrix. Sets of FIFO logic 406 (e.g., FIFO logic 204 and 210) are coupled to the interconnect 404. Notably, the asynchronous input and output terminals of each set of FIFO logic 406 are coupled to the interconnect 404. For example, the FIFO logic 406 may comprise a BRAM tile, as described above. In this manner, an asynchronous output terminal of any set of FIFO logic 406 may be connected to an asynchronous input terminal of any other set of FIFO logic 406 by appropriately configuring the switch boxes 402. The mesh network may be disposed in the FPGA 100 and the switch boxes may be programmably configured using the configuration memory and configuration data similar to the manner in which the programmable interconnect of the FPGA 100 is programmed.

Figure 5:
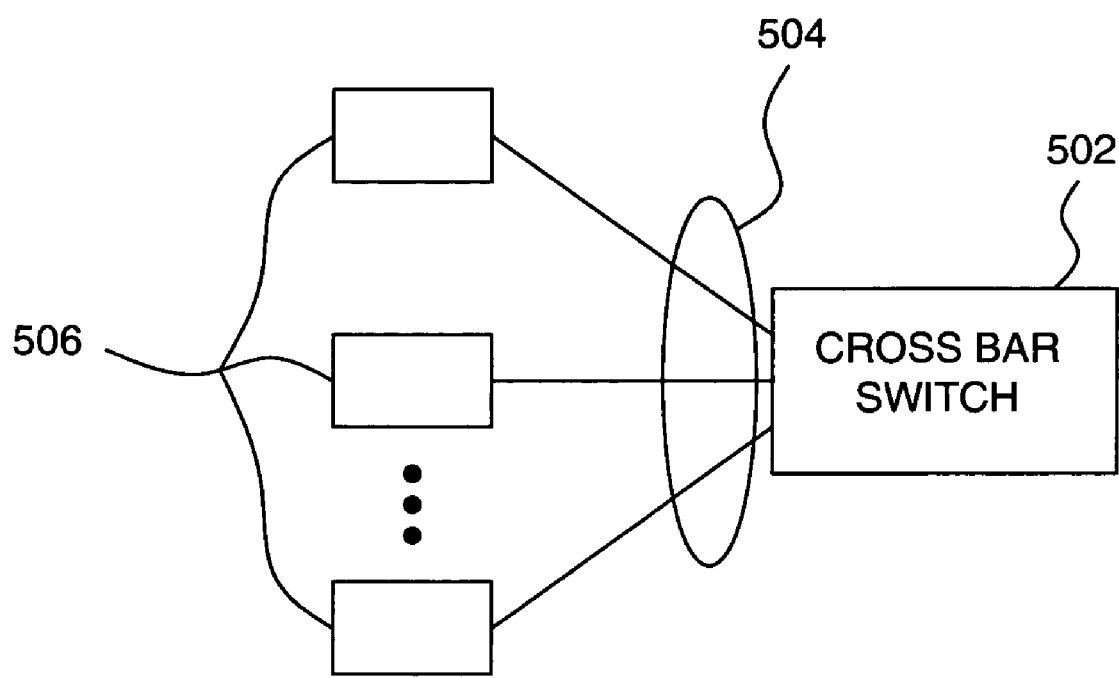
FIG. 5 is a block diagram depicting another exemplary embodiment of an interconnection network of FIG. 2 in accordance with the invention.

FIG. 5 is a block diagram depicting another exemplary embodiment of the interconnection network 206 of FIG. 2 in accordance with the invention. In the present embodiment, the interconnection network 206 comprises a crossbar switch 502 and interconnect 504. The interconnect 504 (e.g., signal conductors) connect sets of FIFO logic 506 to the crossbar switch 502. Notably, the interconnect 504 connects the asynchronous input and output terminals of each set of FIFO logic 506 to the cross bar switch. For example, the FIFO logic 506 may comprise a BRAM tile, as described above. In this manner, an asynchronous output terminal of any set of FIFO logic 506 may be connected to an asynchronous input terminal of any other set of FIFO logic 506 by appropriately configuring the crossbar switch 502. The crossbar switch 502 may be disposed in the FPGA 100 and may be programmably configured using the configuration memory and configuration data similar to the manner in which the programmable interconnect of the FPGA 100 is programmed.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. Apparatus for communication, comprising:
an integrated circuit including a first logic circuit, a second logic circuit, first first-in-first-out (FIFO) logic, second FIFO logic, and an interconnection network;
wherein said first FIFO logic and said second FIFO logic each comprise:
a dual-port memory having a write port and a read port;
an asynchronous receiver in communication with said write port;
an asynchronous driver in communication with said read port; and
a multiplexer having a first input port in communication with said asynchronous receiver, a second input port in communication with a respective one of said first logic circuit and said second logic circuit, and an output port in communication with said write port;
wherein said first FIFO logic and said second FIFO logic are configured for asynchronous serial communication over said interconnection network; and
said first FIFO logic and said second FIFO logic are configured to respectively communicate with each said first logic circuit and said second logic circuit in respective synchronous time domains.

2. The apparatus of claim 1, wherein said integrated circuit comprises a field programmable gate array (FPGA), and wherein each said dual-port memory comprises a block random access memory (BRAM).

3. The apparatus of claim 1, wherein each said asynchronous receiver comprises:
a deserializer in communication with said interconnection network; and
control logic in communication with a respective one of said FIFO control logic.

4. The apparatus of claim 1, wherein each said asynchronous driver comprises:
a serializer in communication with said interconnection network; and
control logic in communication with a respective one of said FIFO control logic.

5. The apparatus of claim 1, wherein said first FIFO logic and said second FIFO logic are configured for asynchronous communication of a FIFO control signal between one another.

6. The apparatus 5, wherein said integrated circuit comprises a field programmable gate array (FPGA), and wherein said asynchronous communication of said FIFO control signal is over programmable interconnect of said FPGA.

7. The apparatus of claim 1, wherein said interconnection network comprises a mesh network.

8. The apparatus of claim 1, wherein said interconnection network comprises a crossbar switch.

9. A method for communication in an integrated circuit having a first logic circuit, a second logic circuit, first first-in-first-out (FIFO) logic, second FIFO logic, and an interconnection network, the method comprising;

communicating data between said first logic circuit and said first FIFO logic in a first synchronous time domain, said communicating data between said first logic circuit and said first FIFO logic comprising;
    pushing said data into a first FIFO memory; and
    popping said data from said first FIFO memory to an asynchronous driver in communication with said interconnection network;
serially communicating said data between said first FIFO logic and said second FIFO logic over said interconnection network in an asynchronous time domain; and
communicating said data between said second FIFO logic and said second logic circuit in a second synchronous time domain, said communicating said data between said second FIFO logic and said second logic circuit comprising:
    pushing said data into a second FIFO memory from an asynchronous receiver in communication with said interconnection network; and
    popping said data from said second FIFO memory.

10. The method of claim 9, wherein said step of communicating data between said first FIFO logic and said second FIFO logic comprises:
    transmitting said data from said asynchronous driver to said asynchronous receiver.

11. The method of claim 9, wherein said step of popping said data from said first FIFO memory comprises:
    reading an empty flag state of said first FIFO memory at said asynchronous driver.

12. The method of claim 9, further comprising:
    reading an almost-full flag state of said second FIFO memory; and
    sending data indicative of said almost-full flag state to said first FIFO logic asynchronously.

13. The method of claim 9, wherein said integrated circuit comprises a field programmable gate array (FPGA), and wherein each of said first FIFO memory and said second FIFO memory comprise a block random access memory (BRAM).

14. An integrated circuit, comprising:
    a first logic circuit;
    a second logic circuit;
    an interconnection network comprising a mesh network formed inside a programmable logic device (PLD) and separate from the programmable interconnect structure of said PLD;
    first first-in-first-out (FIFO) logic coupled to said first logic circuit and said interconnection network;
    second FIFO logic coupled to said second logic circuit and said interconnection network;
    each said first FIFO logic and said second FIFO logic configured for asynchronous serial communication over said interconnection network; and
    each said first FIFO logic and said second FIFO logic configured to respectively communicate with each said first logic circuit and said second logic circuit in respective synchronous time domains.

15. The integrated circuit of claim 14, wherein each said first FIFO logic and said second FIFO logic comprises:
    a dual-port memory having a write port and a read port;
    FIFO control logic configured to implement a FIFO using said dual-port memory;
    an asynchronous receiver in communication with said write port; and
    an asynchronous driver in communication with said read port.

16. The integrated circuit of claim 14, wherein said interconnection network comprises a crossbar switch.

\* \* \* \* \*